(12) United States Patent
Ward et al.

(10) Patent No.: US 7,925,948 B2
(45) Date of Patent: Apr. 12, 2011

(54) SYSTEM AND METHOD FOR POWER REDUCTION THROUGH POWER AWARE LATCH WEIGHTING

(75) Inventors: Samuel I. Ward, Round Rock, TX (US); Benjiman L. Goodman, Cedar Park, TX (US); Joshua P. Hernandez, Paige, TX (US); Linton B. Ward, Jr., Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 12/206,789

(22) Filed: Sep. 9, 2008

(65) Prior Publication Data

US 2010/0064189 A1    Mar. 11, 2010

(51) Int. Cl.
*G01R 31/28* (2006.01)

(52) U.S. Cl. ........ 714/732; 714/726; 714/729; 714/742; 324/763; 324/765

(58) Field of Classification Search .................. 714/732, 714/726, 729, 742; 324/763, 765
See application file for complete search history.

(56) References Cited

U.S. PATENT DOCUMENTS

| 6,442,720 | B1 * | 8/2002 | Koprowski et al. | 714/726 |
| 6,658,616 | B1 | 12/2003 | Chang et al. | |
| 6,968,489 | B2 | 11/2005 | Motika et al. | |
| 6,986,090 | B2 * | 1/2006 | Hathaway et al. | 714/727 |
| 7,743,306 | B2 * | 6/2010 | Wen et al. | 714/739 |
| 7,840,865 | B2 * | 11/2010 | Lai et al. | 714/728 |
| 2003/0140293 | A1 | 7/2003 | Motika et al. | |
| 2003/0163297 | A1 | 8/2003 | Khaira et al. | |
| 2008/0235543 | A1 * | 9/2008 | Wen et al. | 714/724 |

OTHER PUBLICATIONS

Lin et al., A Cocktail Approach on Random Access Scan Toward Low Power and High Efficiency Test, 2005, IEEE, pp. 94-99.*
Wu wt al., Scan-Chain Reordering for Minimizing Scan-Shift Power Based on Non-Specified Test Cubes, Apr. 27, 2008, IEEE, pp. 147-154.*
Maiti et al., Don't care filling for power minimization in VLSI circuit testing, May 18, 2008, IEEE, pp. 2637-2640.*
Lee et al., Reduction of Power and Test Time by Removing Cluster of Don't-Care from Test Data Set, 2005, IEEE, pp. 1-2.*
Kajihara et al., On identifying don't care inputs of test patterns for combinational circuits, 2001, IEEE, pp. 364-369.*
S. Wang and S.K. Gupta "ATPG for heat dissipation minimization during scan testing," Proc. 1994 IEEE Int. Test Conf., Oct. 1994, pp. 250-258.
R. Saukaralingam, R.R. Oruganti, and N.A. Touba, "Static compaction techniques to control can vector power dissipation," Proc. 2000 IEEE VLSI Test Symp., Apr.-May 2000, pp. 35-40.

* cited by examiner

*Primary Examiner* — John J Tabone, Jr.
(74) *Attorney, Agent, or Firm* — Patrick E. Caldwell, Esq.; The Caldwell Firm, LLC

(57) ABSTRACT

A system comprises a circuit analysis module configured to analyze a device under test (DUT), the DUT comprising a plurality of latches coupled together in a scan chain. A don't-care analysis module identifies absolute don't-care latches within the DUT, assigns a weighted value to the bit positions of identified don't-care latches, and identifies absolute don't-care bits within a general test pattern. The circuit analysis module replaces identified absolute don't-care bits in the general test pattern according to the weighted value of the associated bit position, generating a weighted test pattern. A test vector module generates a test vector based on the weighted test pattern and an input module applies the test vector to the DUT.

21 Claims, 3 Drawing Sheets

SYSTEM AND METHOD FOR POWER REDUCTION THROUGH POWER AWARE LATCH WEIGHTING

CROSS-REFERENCE TO RELATED APPLICATIONS

This application relates to co-pending U.S. patent application entitled SYSTEM AND METHOD FOR POWER REDUCTION THROUGH POWER AWARE LATCH WEIGHTING OF COMPLEX SUB-CIRCUITS Ser. No. 12/206,781, filed concurrently herewith.

TECHNICAL FIELD

The present invention relates generally to the field of logic device testing, and more particularly, a system and method power reduction through power aware latch weighting.

BACKGROUND OF THE INVENTION

Modern electronic testing systems perform certain electronic circuit tests at the designed operational speed of the device under test (DUT). But performing structural tests of electronic devices at operation speed can introduce many problems. One primary problem is increased power consumption during switching. This increased power consumption experienced during operational speed testing can often be much higher than the power consumption experienced during the DUT's normal operation. As such, the increased power consumption can affect test results, causing the device under test to fail, or appear to fail. For example, in some fault tests, increased switching power consumption during scan capture can degrade performance to the point of test failure. Additionally, in all fault tests, the increased power consumption during switching can aggravate IR-drop and crosstalk, which can also manifest as a failed test. Worse, increased power consumption can cause faults, introducing stress-related failures in the device under test.

In order to address this problem, industry has developed testing methods that attempt to reduce power consumption during the testing process. Many conventional methods restrict the test application to only those portions of the DUT that are currently being tested. The logic operators and other portions of the DUT that are not being tested are assigned a random bit as a place holder during the testing process. These logic operators are called non-determinative operators and often notated as "do not care" or don't-care bits.

Conventional systems randomly fill don't-care with either a zero or a one. The typical random fill method can provide a slight increase in fault coverage by detecting faults not explicitly targeted during a test, sometimes referred to as "fortuitous detection." Industry studies have shown fortuitous detection coverage to be very similar to randomly filled don't-care values, which is relatively high for the first few patterns. However, the coverage provided by fortuitous detection drops very quickly with subsequent patterns.

Further, randomly filling the don't-care bits can also introduce power related problems. For example, randomly filling the don't-care bits can cause an increased number of transitions during scan-in, relative to simply filling in the don't-care bits with all zeros. The increase number of transitions can, in turn, cause high power dissipation. The increased power dissipation during scan-in can be mitigated somewhat by lowering the test frequency, but lowering the test frequency increases the total time necessary to conduct the test. Worse, often 80% or more of the data bits in the scan chain being shifted into the chip are don't-care values, which magnifies the problems caused by randomly filling the "don't' care" bits.

Industry has developed several heuristic methods to select the fill value for don't-care bits. One modern heuristic method assigns all don't-care bits a value of zero, called the "tie to zero" method. Another modern method assigns all don't-care bits a value of one, called the "tie to one" method. The "thousand fill" method fills the don't-care bits of the first 1,000 post compaction results with all zeros, and fills the don't-care bits of the next 1,000 patterns with all ones, repeating the alternation in blocks of 1,000 for the remainder of the test patterns. The "random chain" method randomly selects half of the scan chains, filling the don't-care bits in the selected chains with all ones, and filling the don't-care bits in the rest of the chains randomly.

The "fill adjacent" method uses information about the care bits to fill in values of the don't-care bits on a care bit by care bit basis. Specifically, the fill adjacent method fills don't-care bits with the most recent care bit value until another care bit is reached, after which the new care bit value is applied. The "minimum-transition fill" method uses a process similar to that of the "fill adjacent" method, and includes aspects to reduce transitions in the test vector. The "random four adjacent" method randomly selects four chains, filling the don't-care bits of the selected chains according to the fill adjacent method, and fills the don't-care bits in the remaining patterns randomly.

As shown, current heuristic methods for modern electronic testing systems try to reduce overall switching power by reducing the overall average power. Most systems use a general method for determining all don't-care values. But a general method, applied to all devices under test, does not take into account actual circuit topology to reduce power, largely because current heuristics cannot efficiently process actual circuit topography. These conventional methods look only at specific simple heuristics to attempt to reduce the power on an average basis, across many different devices. As such, typical methods to reduce average power fail to achieve the power reduction possible if actual circuit topography were considered.

Therefore, there is a need for a system and/or method for power reduction in at-speed circuit testing that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A system comprises a circuit analysis module configured to analyze a device under test (DUT), the DUT comprising a plurality of latches coupled together in a scan chain. A don't-care analysis module identifies absolute don't-care latches within the DUT, assigns a weighted value to the bit positions of identified don't-care latches, and identifies absolute don't-care bits within a general test pattern. The circuit analysis module replaces identified absolute don't-care bits in the general test pattern according to the weighted value of the associated bit position, generating a weighted test pattern. A test vector module generates a test vector based on the weighted test pattern and an input module applies the test vector to the DUT.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
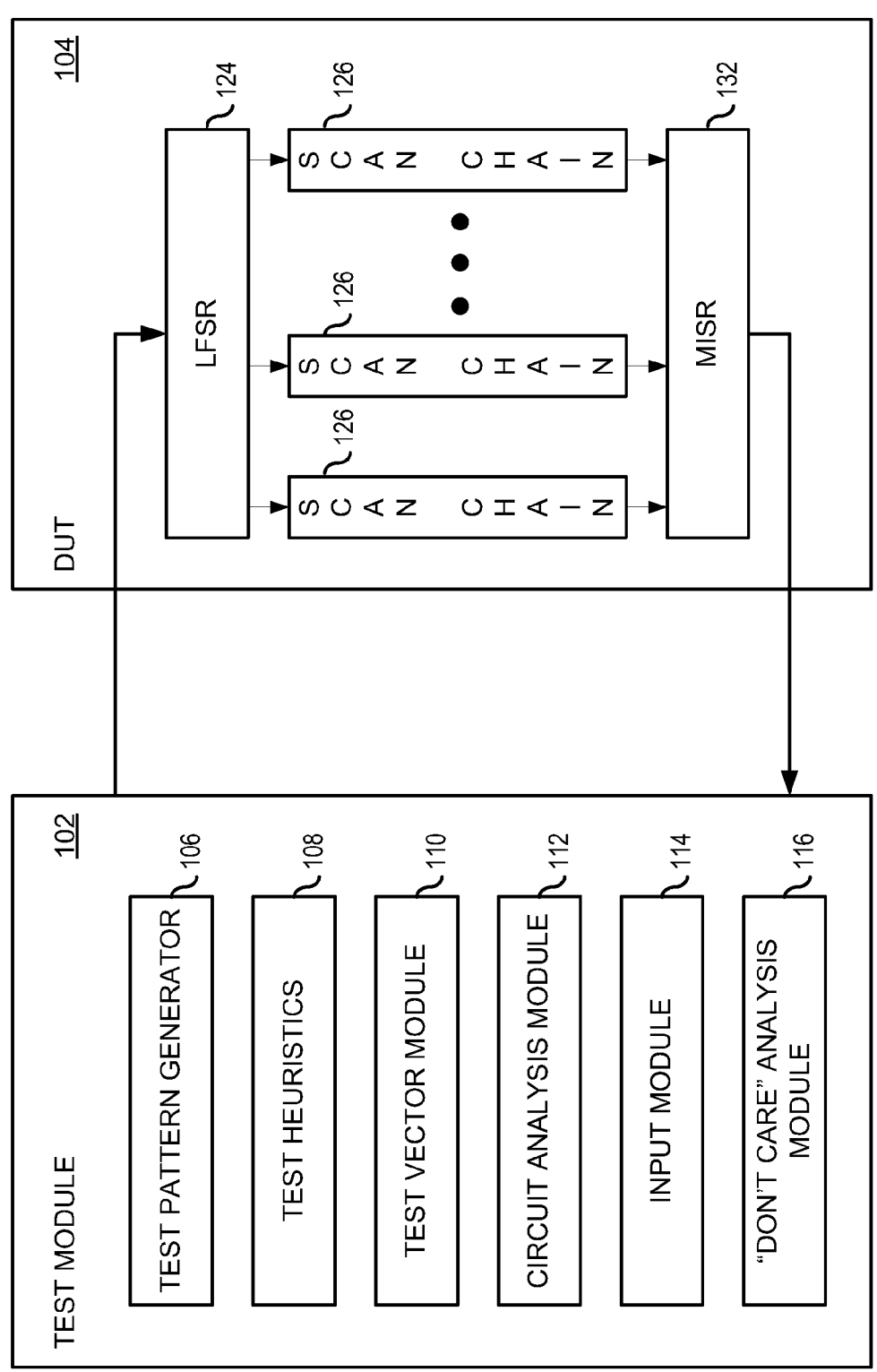
FIG. 1 illustrates a block diagram showing a test module connected to a device under test in accordance with a preferred embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of a system 100 for power reduction through power aware latch weighting, in accordance with one embodiment of the present invention. In the illustrated embodiment, system 100 comprises a test module 102 and a device under test (DUT) 104.

In the illustrated embodiment, test module 102 is an otherwise conventional test module, modified as described below. Test module 102 comprises a test pattern generator 106, a test heuristics module 108, a test vector module 110, a circuit analysis module 112, an input module 114, and a don't-care analysis module 116.

In the illustrated embodiment, test pattern generator 106 is an otherwise conventional test pattern generator, modified as described below. Generally, test pattern generator 106 generates a test pattern for DUT 104 based on data provided by test heuristics module 108.

In the illustrated embodiment, test heuristics module 108 is an otherwise conventional test heuristics module, modified as described below. Generally, test heuristics module 108 develops test heuristics for the particular device under test. In one embodiment, test heuristics module 108 develops test heuristics for DUT 104 based on user input.

In the illustrated embodiment, test vector module 110 is an otherwise conventional test vector module, modified as described below. Generally, test vector module 110 generates test vectors to be applied to DUT 104 based on the test pattern generated by test pattern generator 106, and don't-care analysis module 116.

In the illustrated embodiment, circuit analysis module 112 is an otherwise conventional circuit analysis module, modified as described below. Generally, in one embodiment, circuit analysis module determines the logical description of the circuits in DUT 104.

In the illustrated embodiment, input module 114 is an otherwise conventional input module modified as described below. Generally, input module 114 receives user input, which includes configuration data to modify the test heuristics, test patterns, test vectors, and other test data, as described in more detail below.

In the illustrated embodiment, don't-care analysis module 116 is an otherwise conventional don't-care analysis module, modified as described below. Generally, don't-care analysis module 116 identifies absolute and don't-care latches in DUT 104. Don't-care analysis module 116 assigns weights to the absolute and conditional don't-care latches in DUT 104 as described in more detail below.

Additionally, don't-care analysis module 116 identifies absolute and conditional don't-care bits in the test pattern generated by test pattern generator 106. In one embodiment, don't-care analysis module 116 replaces the absolute and applicable conditional don't-care bits in the test pattern generated by test pattern generator 106.

In the illustrated embodiment, DUT 104 is an otherwise conventional electronic circuit device under test. DUT 104 comprises linear feedback shift register (LFSR) 124, various scan chains 126, and a multiple input signature register (MISR) 132. In the illustrated embodiment, LFSR 124 is an otherwise conventional LFSR and receives a linear test vector used for testing various scan chains of DUT 104. Each scan chain 126 is an otherwise conventional scan chain, connecting every logical operator in DUT 104 into a long shift register. When test module 102 applies the test vector to DUT 104 through LFSR 124, test module 102 can read out the operation of every logical operator and the state of every logical operator, through MISR 132. MISR 132 is an otherwise conventional MISR, configured to unload the responses of the scan chains 126 into test module 102.

In a general exemplary operation in accordance with one embodiment, described in additional detail below, circuit analysis module 112 analyzes the circuits of DUT 104. Circuit analysis module 112 identifies the circuit topography of DUT 104. Don't-care analysis module 116 identifies absolute and conditional don't-care latches within DUT 104. Don't-care analysis module 116 assigns weights to the identified absolute and conditional don't-care latches within DUT 104 based on the identified circuit topography of DUT 104.

In the illustrated exemplary operative embodiment, don't-care analysis module 116 assigns weights to identified absolute and conditional don't-care latches by determining the latch value that will prevent the associated gate from propagating an input signal, and thus from propagating signals farther down the cone of logic. This reduces overall switching within the circuit, thereby reducing power.

For example, in one embodiment, for a NAND gate, the weighted value is a zero, so that the output of the NAND gate remains a one value, even if the other input changes. For a NOR gate, the selected weight value is a one, so that the other input to the NOR gate is blocked and a zero propagates forward on that gate. Table A illustrates additional exemplary weights:

TABLE A

Exemplary Weights for Various Common Gates

| Gate | Input A Weight | Input B Weight | Input C Weight | Input D Weight |
|---|---|---|---|---|
| NAND-2 | 0 | 0 | n/a | n/a |
| NAND-3 | 0 | 0 | 0 | n/a |
| NOR-2 | 1 | 1 | n/a | n/a |
| NOR-3 | 1 | 1 | 1 | n/a |
| AOI 2 × 2 | 0 | 0 | 0 | 0 |
| AOI 2 × 1 | 0 | 0 | 0 | n/a |
| XOR | Propagate | Propagate | Propagate | Propagate |
| XNOR | Propagate | Propagate | Propagate | Propagate |

As shown, the input weights of Table A block fluctuation in gate output. One skilled in the art will understand that XOR and XNOR gates cannot be set by a single input and, as such, must propagate whatever switching occurs at the gate.

In the illustrated exemplary operative embodiment, test heuristics module 108 develops test heuristics based on the circuit topography of DUT 104. Generally, test heuristics identify the particular faults the test patterns will find during the actual circuit test and the circuit components to be tested.

Test pattern generator 106 develops the general test pattern in response to the test heuristics developed by test heuristics module 108.

Figure 2:
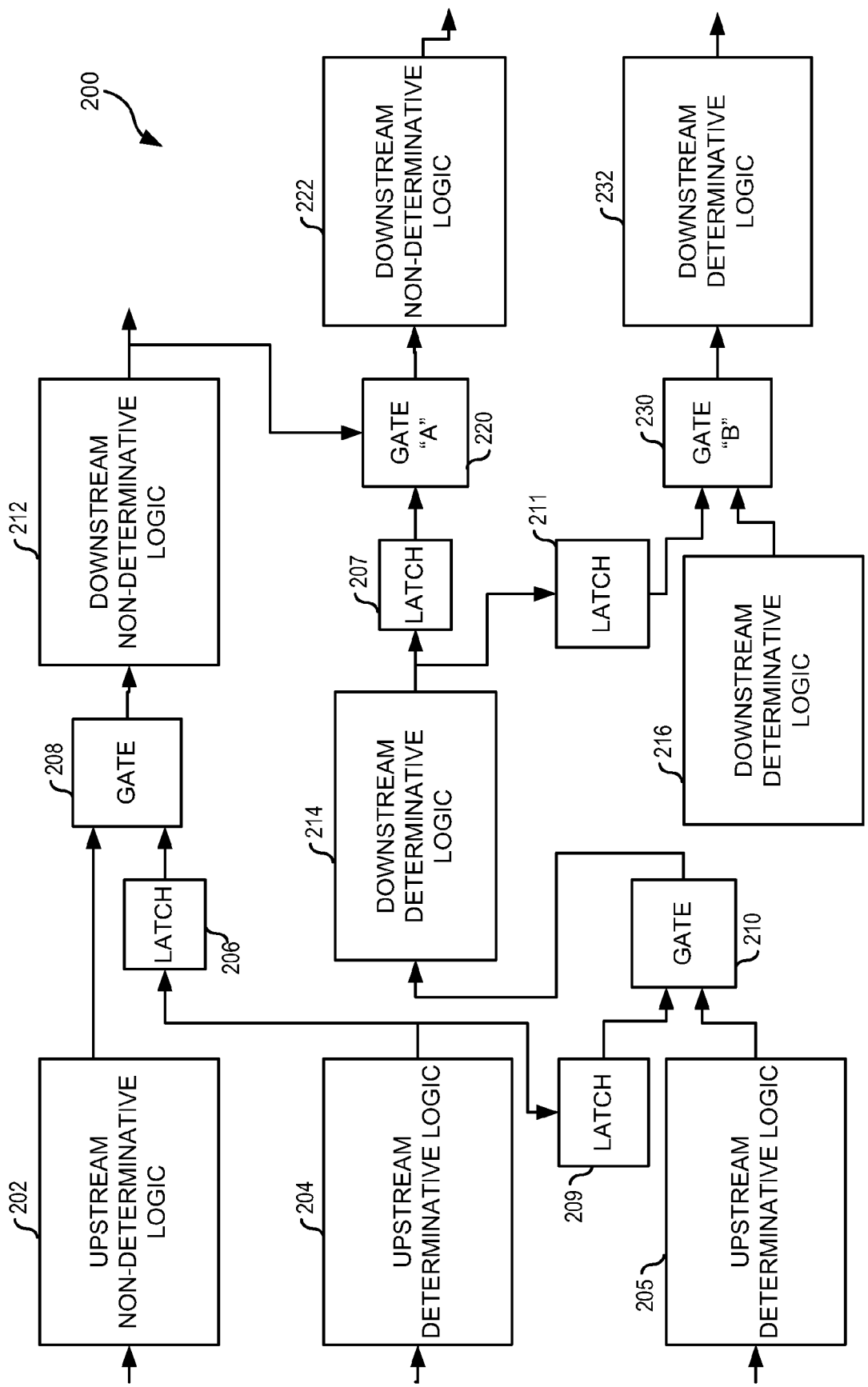
FIG. 2 illustrates a block diagram showing a scan chain of a device under test in accordance with a preferred embodiment.

In the illustrated exemplary operative embodiment, don't-care analysis module 116 searches the test pattern developed by test pattern generator 106 and identifies the absolute and conditional don't-care bits within the test pattern. Generally, an "absolute don't-care" bit is a bit that does not, in any case, affect the test output signature. Generally, a "conditional don't-care" bit is a bit that, in some cases, does not affect the test output signature. FIG. 2 and the accompanying description below provide additional detail regarding absolute and conditional don't-care bits and latches.

Don't-care analysis module 116 replaces the identified absolute and conditional don't-care bits with weighted values selected to reduce switching power consumption by preventing the selected gate from propagating a fluctuating signal, described in more detail below. Test vector module 110 develops a test vector based on the weighted test pattern produced by test pattern generator 106 and don't-care analysis module 116.

In the illustrated exemplary operative embodiment, test module 102 applies the test vector to DUT 104 through LFSR 124. The test patterns propagate through the various scan chains 126 to MISR 132, which compresses the output into a test signature suitable for review. Thus, FIG. 1 illustrates one embodiment of a system for reducing power during at-speed testing by selecting fill values for don't-care bits so as to minimize non-determinative switching. FIG. 2 illustrates in more detail a mechanism to identify absolute and conditional don't-care bits that are suitable for the power aware weighting described herein.

Specifically, FIG. 2 illustrates system 200, which comprises a plurality of logic operators of a DUT, coupled together to form a part of a scan chain. One skilled in the art will understand that logic operators coupled in a scan chain can be in distinct and different functional devices. As illustrated, system 200 comprises a plurality of determinative and non-determinative logic, and various latches and gates.

In particular, system 200 includes upstream non-determinative logic 202, upstream determinative logic 204, and upstream determinative logic 205. Generally, upstream non-determinative logic 202 represents circuit components positioned earlier in the functional or scan path that do not determine the output of the test for the test pattern, heuristic, or vector under consideration. As shown, the output of upstream non-determinative logic 202 feeds (through gate 208) downstream non-determinative logic 212. As such, the test patterns applied to the DUT can fill the bit positions associated with the latches of upstream non-determinative logic 202 (and downstream non-determinative logic 212) with don't-care bits.

For example, both upstream non-determinative logic 202 and latch 206 are inputs to gate 208. Conventional systems would fill the test pattern bit positions associated with latch 206 and upstream non-determinative logic 202 in one of the conventional don't-care fill heuristics described above. As such, depending on the particular logic function of gate 208, the gate 208 output may switch frequently, causing wasted power dissipation. In the embodiments disclosed herein, however, the test module sets the bit in the bit position associated with latch 206 based on the particular logic function of gate 208, so as to force the output of gate 208 into a stable, unchanging signal.

For example, as described above, where gate 208 is a NAND gate and latch 206 is an absolute don't-care latch, the test module sets the bit in the bit position associated with latch 206 to zero. As such, the output of (NAND) gate 208 is fixed at zero, reducing switching associated with fluctuation in the gate 208 output. Further, fixing the output of gate 208 fixes the input to downstream non-determinative logic 212. As the input to downstream non-determinative logic 212 is not changing, the logic comprising downstream non-determinative logic 212 does not change either, also reducing switching power.

Upstream determinative logic 204 provides input to both latch 206 and latch 209. In the event the upstream determinative logic 204 output changes, the input to latch 206 changes. As such, in some cases, the don't-care bits of upstream non-determinative logic 202 can be fixed to provide the weighted input to latch 206 to fix gate 208 output.

As illustrated, upstream determinative logic 204 (though latch 209) and upstream determinative logic 205 provide input to gate 210. As such, gate 210 is not a don't-care latch, as its state will affect the output test signature. Accordingly, system 200 applies to latch 210 the bit value for the bit position in the test pattern associated with latch 210, as is typical.

Accordingly, in general operation, system 200 applies either the test pattern bit value or the modified don't-care bit value described herein to each bit position in the scan chain, according to that bit position. Generally, the system sets determinative logic latches (latches that follow or feed determinative logic) according to the test pattern bit provided for the test. Generally, the system sets non-determinative logic latches according to the process described herein, further distinguishing between absolute and conditional don't-care status.

Generally, an "absolute don't-care latch" is a latch that does not affect the test result output signature for the test pattern under consideration in any case. An "absolute don't-care bit" is a bit position in a test vector associated with an absolute don't-care latch. As described above, in the illustrated embodiment, latch 206 is an absolute don't-care latch.

A "conditional don't-care" latch is a latch that sometimes does not affect the test result output signature for the test pattern under consideration, depending on other factors as one skilled in the art will understand. A "conditional don't-care bit" is a bit position in a test vector associated with a conditional don't-care latch. For example, as illustrated, downstream determinative logic 214 feeds latch 207, which is one of the inputs to gate "A" 220. The other input to gate "A" 220 is downstream non-determinative logic 212. Because gate "A" 220 feeds downstream non-determinative logic 222, it is an absolute don't-care latch.

But downstream determinative logic also feeds latch 211, which is one of the inputs to gate "B" 230. The other input to gate "B" 230 is downstream determinative logic 216. Depending on the logic function embodied in gate "B" 230, the bit value stored in latch 211 might have no effect on the output of gate "B" 230. For example, where gate "B" 230 is an AND gate, and downstream determininative logic 216 output is a zero, the gate "B" 230 output will be zero regardless of what bit value is stored by latch 211. As such, latch 211 is a "conditional don't-care latch."

Thus, in one embodiment, a circuit analysis module identifies the particular logic gates and don't-care latches in a device under test, and a don't-care analysis module determines whether a particular latch is an absolute or conditional don't-care latch. A test vector module uses the results from the don't-care analysis module to set the particular don't-care bits in the test pattern to apply to the DUT for testing. Thus, generally, in one embodiment, system 100 of FIG. 1 operates on a DUT, such as system 200 of FIG. 2, as described with respect to FIG. 3.

Figure 3:
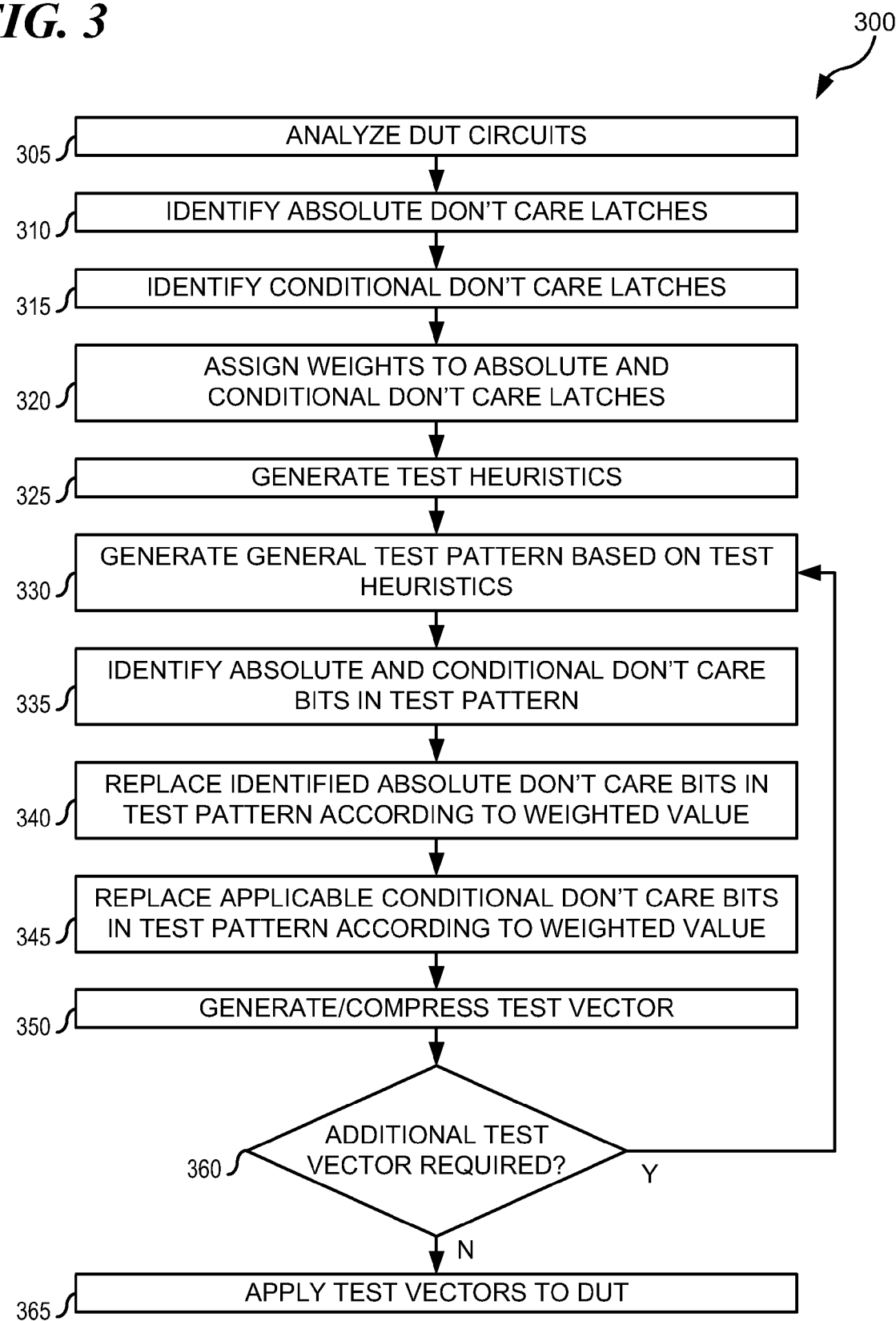
FIG. 3 illustrates a high-level flow diagram depicting logical operational steps for reducing power through power aware latch weighting, which can be implemented in accordance with a preferred embodiment.

Specifically, FIG. 3 illustrates a high-level flow chart 300 that depicts logical operational steps performed by, for example, system 100 of FIG. 1, which may be implemented in accordance with a preferred embodiment. Generally, test module 102 performs the steps of the method, unless indicated otherwise. As indicated at block 305, the process begins, and system 100 analyzes the circuits of a DUT. For example, circuit analysis module 112 of test module 102 analyzes the circuits of DUT 104.

Next, as indicated at block 310, system 100 identifies the absolute don't-care latches. For example, don't-care analysis module 116 identifies the absolute don't-care latches in DUT 104. Next, as indicated at block 315, system 100 identifies the conditional don't-care latches in the DUT. For example, don't-care analysis module 116 identifies the conditional don't-care latches in DUT 104.

Next, as indicated at block 320, system 100 assigns weights to the identified absolute and conditional don't-care latches. For example, don't-care analysis module assigns weights to the absolute and don't-care latches in DUT 104. Next, as indicated at block 325, system 100 generates test heuristics for the DUT. For example, test heuristics module 108 generates test heuristics for DUT 104.

Next, as indicated at block 330, system 100 generates a general test pattern based on the test heuristics. For example, test pattern generator 106 generates a general test pattern based on the test heuristics developed by test heuristics module 108. Next, as indicated at block 335, system 100 identifies absolute and conditional don't-care bits in the test pattern. For example, don't-care analysis module 116 identifies absolute and conditional don't-care bits in the test pattern generated by test pattern generator 106.

Next, as indicated at block 340, system 100 replaces the identified absolute don't-care bits in the test pattern according to a weighted value for the latch associated with the bit position of each don't-care bit. For example, don't-care analysis module 116 replaces the identified absolute don't-care bits in the test pattern with a weighted value selected so that the logic gate will not propagate a changing signal, as described above. Next, as indicated at block 350, system 100 replaces applicable conditional don't-care bits in the test pattern according to a weighted value. For example, don't-care analysis module 116 replaces the applicable conditional don't-care bits in the test pattern generated by test pattern generator 106 with a weighted value for the latch associated with the bit position of each don't-care bit.

Next, as indicated at block 355, system 100 generates or compresses a test vector. For example, test vector module 110 generates or compresses a test vector based on the test pattern generated by test pattern generator 106 and modified by circuit analysis module 116. Next, as indicated at block 360, system 100 determines if additional test vectors are required. For example, test vector module 110 determines if additional test vectors are required for DUT 104.

As indicated at decisional block 360, if additional test vectors are not required, the process continues along the NO branch to block 365. As indicated at block 365, system 100 applies the test vectors to the DUT and the process ends. For example, input module 114 applies the test vectors to DUT 104 through LFSR 124. If at decisional block 360 additional test vectors are required the process continues along the YES branch, returning to block 330.

Accordingly, the disclosed embodiments provide numerous advantages over other methods and systems. For example, the disclosed embodiments provide a testing power reduction technique that does not cause an increased number of transitions during scan-in, and accordingly does not cause high power dissipation. Further, the disclosed embodiments achieve the described power reduction without decreasing the test clock frequency, which allows at-speed testing.

Additionally, the disclosed embodiments do not cause unnecessary yield loss, usually associated with at-speed testing. The disclosed embodiments also reduce associated IR-drop, crosstalk, and the risk of high-stress related failures. Moreover, the disclosed embodiments account for the actual device under test, rather than a general device, which improves test performance over conventional power reduction methods. Accordingly, the embodiments disclosed herein reduce power by taking into account the actual topography of the device under test, and using the known topography to select bit values to fill in otherwise don't-care bit positions, reducing switching power.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

The invention claimed is:

1. A system embodied in a hardware system, comprising:
a circuit analysis module configured to analyze a device under test (DUT), the DUT comprising a plurality of latches coupled together in a scan chain, each latch being associated with a corresponding bit position;
a don't-care analysis module configured to identify absolute don't-care latches within the DUT;
wherein the don't-care analysis module is further configured to assign a weighted value to the corresponding bit positions of the identified absolute don't-care latches;
wherein the don't-care analysis module is further configured to identify absolute don't-care bits within a general test pattern;
wherein the circuit analysis module is further configured to replace identified absolute don't-care bits in the general test pattern according to the weighted value of the associated bit position, to generate a weighted test pattern;
a test vector module configured to generate a test vector based on the weighted test pattern; and an input module configured to apply the test vector to the DUT.

2. The system of claim 1, wherein analyzing a DUT comprises:
    determining DUT topography;
    identifying logic gates within the DUT; and
    determining the logic operation of each identified logic gate.

3. The system of claim 1, wherein assigning a weighted value comprises:
    selecting a value for the bit position associated with each don't-care latch such that the output signal from the logic gate associated with each don't care latch does not change; and
    storing the selected value as the weighted value for the latch.

4. The system of claim 1, further comprising:
    a test heuristics module configured to generate test heuristics; and
    a test pattern generator module configured to generate the general test pattern based on the test heuristics.

5. The system of claim 1, further comprising:
    wherein the don't-care analysis module is further configured to identify conditional don't-care latches within the DUT;
    wherein the don't-care analysis module is further configured to identify conditional don't-care bits within the test pattern; and
    wherein the circuit analysis module is further configured to replace identified conditional don't-care bits in the general test pattern according to the weighted value of the associated bit position, to generate a weighted test pattern.

6. The system of claim 1, wherein:
    at least one don't care latch comprises an input to an OR gate; and
    the weighted value for the bit position associated with the at least one don't care latch is a logic "1".

7. The system of claim 1, wherein:
    at least one don't care latch comprises an input to an AND gate; and
    the weighted value for the bit position associated with the at least one don't care latch is a logic "0".

8. A method for power reduction in at-speed test switching through power aware latch weighting, comprising:
    analyzing a device under test (DUT), the DUT comprising a plurality of latches coupled together in a scan chain, each latch being associated with a corresponding bit position;
    identifying absolute don't-care latches within the DUT;
    assigning a weighted value to the corresponding bit positions of the identified absolute don't-care latches;
    identifying absolute don't-care bits within a general test pattern;
    replacing identified absolute don't-care bits in the general test pattern according to the weighted value of the associated bit position, to generate a weighted test pattern;
    generating a test vector based on the weighted test pattern; and
    applying the test vector to the DUT.

9. The method of claim 8, wherein analyzing a DUT comprises:
    determining DUT topography;
    identifying logic gates within the DUT; and
    determining the logic operation of each identified logic gate.

10. The method of claim 8, wherein assigning a weighted value comprises:
    selecting a value for the bit position associated with each don't-care latch such that the output signal from the logic gate associated with each don't care latch does not change; and
    storing the selected value as the weighted value for the latch.

11. The method of claim 8, further comprising:
    generating test heuristics; and
    generating the general test pattern based on the test heuristics.

12. The method of claim 8, further comprising:
    identifying conditional don't-care latches within the DUT;
    identifying conditional don't-care bits within the test pattern; and
    replacing identified conditional don't-care bits in the general test pattern according to the weighted value of the associated bit position, to generate a weighted test pattern.

13. The method of claim 8, wherein:
    at least one don't care latch comprises an input to an OR gate; and
    the weighted value for the bit position associated with the at least one don't care latch is a logic "1".

14. The method of claim 8, wherein:
    at least one don't care latch comprises an input to an AND gate; and
    the weighted value for the bit position associated with the at least one don't care latch is a logic "0".

15. A computer program product for power reduction through power aware latch weighting, the computer program product comprising:
    a non-transitory computer usable medium having computer useable program code embodied therewith, the computer useable program code comprising:
    computer usable program code configured to analyze a device under test (DUT), the DUT comprising a plurality of latches coupled together in a scan chain, each latch being associated with a corresponding bit position;
    computer usable program code configured to identify absolute don't-care latches within the DUT;
    computer usable program code configured to assign a weighted value to the corresponding bit positions of the identified absolute don't-care latches;
    computer usable program code configured to identify absolute don't-care bits within a general test pattern;
    computer usable program code configured to replace identified absolute don't-care bits in the general test pattern according to the weighted value of the associated bit position, to generate a weighted test pattern;
    computer usable program code configured to generate a test vector based on the weighted test pattern; and
    computer usable program code configured to apply the test vector to the DUT.

16. The computer program product of claim 15, wherein analyzing a DUT comprises:
    determining DUT topography;
    identifying logic gates within the DUT; and
    determining the logic operation of each identified logic gate.

17. The computer program product of claim 15, wherein assigning a weighted value comprises:
    selecting a value for the bit position associated with each don't-care latch such that the output signal from the logic gate associated with each don't care latch does not change; and storing the selected value as the weighted value for the latch.

18. The computer program product of claim 15, further comprising:
  computer usable program code configured to generate test heuristics; and
  computer usable program code configured to generate the general test pattern based on the test heuristics.

19. The computer program product of claim 15, further comprising:
  computer usable program code configured to identify conditional don't-care latches within the DUT;
  computer usable program code configured to identify conditional don't-care bits within the test pattern; and
  computer usable program code configured to replace identified conditional don't-care bits in the general test pattern according to the weighted value of the associated bit position, to generate a weighted test pattern.

20. The computer program product of claim 15, wherein:
  at least one don't care latch comprises an input to an OR gate; and
  the weighted value for the bit position associated with the at least one don't care latch is a logic "1".

21. The computer program product of claim 15, wherein:
  at least one don't care latch comprises an input to an AND gate; and
  the weighted value for the bit position associated with the at least one don't care latch is a logic "0".

* * * * *